US008723603B2

(12) United States Patent
Bowers

(10) Patent No.: US 8,723,603 B2
(45) Date of Patent: May 13, 2014

(54) AMPLIFIER WITH VOLTAGE AND CURRENT FEEDBACK ERROR CORRECTION

(75) Inventor: Derek Bowers, Los Altos Hills, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/610,502

(22) Filed: Sep. 11, 2012

(65) Prior Publication Data

US 2014/0070886 A1 Mar. 13, 2014

(51) Int. Cl.
*H03F 3/04* (2006.01)

(52) U.S. Cl.
USPC ............................................. 330/288; 330/260

(58) Field of Classification Search
USPC .................. 330/252–261, 288, 291, 262–265
See application file for complete search history.

(56) References Cited

U.S. PATENT DOCUMENTS

| | | | |
|---|---|---|---|
| 5,179,355 A | 1/1993 | Harvey | |
| 6,724,260 B2 * | 4/2004 | Varner et al. | 330/288 |
| 7,132,860 B2 * | 11/2006 | Lehto | 327/52 |
| 2001/0040482 A1 | 11/2001 | Dening et al. | |
| 2005/0207261 A1 | 9/2005 | Lehto | |
| 2006/0186958 A1 | 8/2006 | Carreto et al. | |

FOREIGN PATENT DOCUMENTS

EP 2424108 A1 2/2012

OTHER PUBLICATIONS

Analog Devices, AMP02 Data Sheet, *High Accuracy Instrumentation Amplifier*, Jan. 2003, 12 pages.
International Search Report of the International Search Authority in PCT/US2013/058198, dated Dec. 26, 2013, 10 pages.

* cited by examiner

*Primary Examiner* — Hieu Nguyen
(74) *Attorney, Agent, or Firm* — Knobbe, Martens, Olson & Bear, LLP

(57) ABSTRACT

Amplifiers with voltage and current feedback error correction are provided. In one embodiment, an amplifier includes a first input terminal, a second input terminal, an output terminal, a first stage, and a voltage feedback amplification circuit. The first stage can be used to generate first and second output currents, which can be used to control a voltage level of the output terminal. The first and second output currents can change in response to a current feedback signal and a differential input signal received between the first and second input terminals. The first stage can also generate a voltage feedback signal, which can be used by the voltage feedback amplification circuit to control a voltage level of the second input terminal based on a voltage level of the first input terminal.

20 Claims, 5 Drawing Sheets

AMPLIFIER WITH VOLTAGE AND CURRENT FEEDBACK ERROR CORRECTION

BACKGROUND

1. Field

Embodiments of the invention relate to electronic devices, and more particularly, to amplifiers.

2. Description of the Related Technology

A voltage feedback amplifier can refer to an amplifier connected in a closed-loop configuration in which the error signal is a voltage signal. In contrast, a current feedback amplifier can refer to an amplifier connected in a closed-loop configuration in which the error signal is a current signal.

FIG. 1 is a circuit diagram of a prior art current feedback amplifier 30. The current feedback amplifier 30 includes a non-inverting input terminal IN+, an inverting input terminal IN−, an output terminal OUT, a first stage 1, a second stage 2, a third stage 3, a compensation capacitor 4, and a feedback circuit 5. The first stage 1 includes first and second input NPN bipolar transistors 11, 12, first and second input PNP bipolar transistors 13, 14, and first and second current sources 15, 16. The second stage 2 includes first and second current mirror NPN bipolar transistors 21, 22 and first and second current mirror PNP bipolar transistors 23, 24. The feedback circuit 5 includes first and second feedback resistors 6, 7.

The input stage 1 can be used to generate a first output current $I_{OUT1}$ and a second output current $I_{OUT2}$, which can change in response to a current feedback signal 9 and a differential input signal received between the non-inverting and inverting input terminals IN+, IN−. The second stage 2 can be used to mirror the first and second output currents $I_{OUT1}$, $I_{OUT2}$ to generate first and second mirrored currents $I_{M1}$, $I_{M1}$, which can be used to charge or discharge the compensation capacitor 4. The output stage 3 can be configured to operate as a voltage buffer, and can be used to control a voltage level of the output terminal OUT based on the voltage across the compensation capacitor 4. The first and second feedback resistors 6, 7 can generate the current feedback signal 9, which can be used to adjust the magnitude of the first and/or second output currents $I_{OUT1}$, $I_{OUT2}$ so as to charge or discharge the compensation capacitor 4 and control the amplifier's output terminal OUT to a voltage level associated with the first and second output currents $I_{OUT1}$, $I_{OUT2}$ being balanced or equalized.

Current feedback amplifiers, such as the current feedback amplifier 30 of FIG. 1, can have faster output slew rates and/or larger bandwidth relative to certain voltage feedback amplifiers. However, current feedback amplifiers can also have relatively worse DC performance characteristics, such as a relatively large input offset voltage, a relatively high input bias current, and/or a relatively poor common-mode rejection ratio (CMRR).

Accordingly, there is a need for improved amplifiers, including, for example, amplifiers having increased bandwidth, improved CMRR, and/or reduced input offset error.

SUMMARY

In one embodiment, an amplifier includes a first input terminal, a second input terminal, an input stage, and a voltage feedback circuit. The input stage includes a first input and a second input, and the second input is electrically connected to the second input terminal. The input stage is configured to generate a first current at a first current output and to generate a second current at a second current output. The input stage is further configured to generate a first voltage feedback signal at a voltage feedback output, which is not a same node as the second input. The first voltage feedback signal is indicative of a voltage level of the second input terminal. The second input of the input stage is configured to receive a current feedback signal, and the first and second currents change in response to the current feedback signal. The voltage feedback circuit includes a first input electrically connected to the first input terminal, a second input configured to receive the first voltage feedback signal, and an output electrically connected to the first input of the input stage. The voltage feedback circuit is configured to control the voltage level of the second input terminal based on the voltage level of the first input terminal.

In another embodiment, a method of electronic amplification includes receiving an input differential signal between a first input terminal and a second input terminal, generating a first current and a second current using an input amplification stage, balancing the first and second currents using a current feedback signal, generating a voltage feedback signal using the input amplification stage, and controlling the voltage level of the second input terminal relative to a voltage level of the first input terminal using the voltage feedback signal. The first and second currents are configured to change in response to the input differential signal. The voltage feedback signal indicates a voltage level of the second input terminal, and the voltage feedback signal is not taken from the second input terminal.

In another embodiment, an amplifier includes a first input terminal, a second input terminal, an input bipolar transistor pair configured to generate a first current and a second current in response to a current feedback signal and an input differential signal received between the first input terminal and the second input terminal, a replica bipolar transistor pair configured to generate a voltage feedback signal at least in part, and a voltage feedback circuit configured to receive the voltage feedback signal. The replica bipolar transistor pair are replicas of the input bipolar transistor pair. Additionally, the voltage feedback circuit is configured to control the voltage level of the second input terminal relative to the voltage level of the first input terminal based on the voltage feedback signal.

In another embodiment, a method of electronic amplification includes receiving an input differential signal between a first input terminal and a second input terminal, generating a first current and a second current using an input amplification stage, mirroring the first current and the second current to generate a first mirrored current and a second mirrored current, respectively, controlling a voltage level of an output terminal based at least in part on the first and second mirrored currents, generating a current feedback signal using a feedback circuit electrically coupled to the output terminal, replicating a portion of the input amplification stage to generate a voltage feedback signal, and controlling the voltage level of the second input terminal relative to a voltage level of the first input terminal using the voltage feedback signal. The first and second currents are configured to change in response to the current feedback signal. Additionally, the first and second currents are configured to change in response to the input differential signal.

DETAILED DESCRIPTION OF EMBODIMENTS

Figure 1:
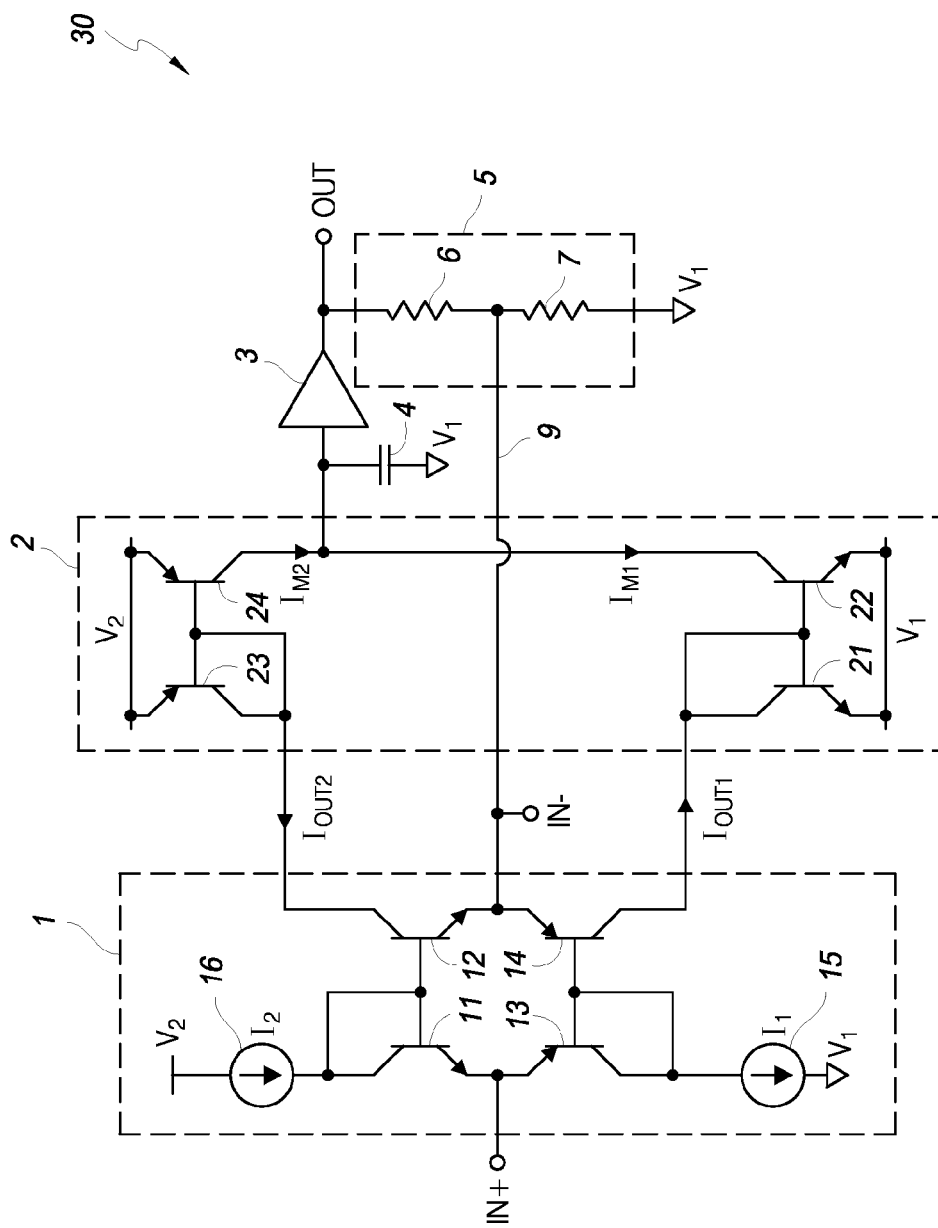
FIG. 1 is a circuit diagram of a prior art current feedback amplifier.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

With continuing reference to FIG. 1, the current feedback amplifier 30 can have low input impedance, which can permit a relatively large transient feedback current to flow into the amplifier as needed to charge or discharge the compensation capacitor 4. In contrast, a voltage feedback amplifier can have a slew rate limited by a current available to charge or discharge a compensation capacitor, which can be limited by a tail current of an input stage. Additionally, the input impedance looking into the inverting input terminal IN− of the current feedback amplifier 30 can be relatively low, and thus the current feedback amplifier 30 can have a greater bandwidth than certain voltage feedback amplifiers, which can have a bandwidth inversely proportional to closed-loop again. However, at high operating gains the bandwidth of the current feedback amplifier 30 can decrease or roll-off as the resistance of the second feedback resistor 7 becomes smaller than the dynamic emitter impedance of the second input NPN and PNP bipolar transistors 12, 14.

Although the current feedback amplifier 30 can theoretically provide an AC performance improvement over certain voltage feedback amplifiers, the current feedback amplifier 30 can become imbalanced when the first and second input NPN bipolar transistors 11, 12 and the first and second input PNP bipolar transistors 13, 14 are not well matched. Although certain design techniques can be used to reduce the impacts of transistor mismatch, transistor non-idealities can nevertheless result in the performance of the current feedback amplifier 30 being relatively worse compared to a configuration using voltage feedback.

Amplifiers with both voltage feedback and current feedback are provided herein. In certain implementations, an amplifier includes a first input terminal, a second input terminal, an output terminal, a first stage, and a voltage feedback amplification circuit. The first stage can be used to generate first and second output currents that change in response to a differential input signal received between the first and second input terminals and in response to a current feedback signal. For example, the current feedback signal can be used to adjust or change the magnitudes of the first and second output currents so as to direct the amplifier to a steady-state operating condition in which the first and second output currents are balanced or equalized. Additionally, the input stage can be configured to generate a voltage feedback signal, which can be used by the voltage feedback amplification circuit to control a voltage level of the second input terminal based on the voltage level of the first input terminal. For example, the voltage feedback amplification circuit can control the voltage levels of the first and second input terminals to be about equal when no differential input signal is received. Using both voltage and current feedback error correction in the amplifier can combine many of the advantages of voltage feedback with many of the advantages of current feedback.

In certain implementations, the voltage feedback signal is generated using replica transistors configured to track bias conditions of input transistors connected to the amplifier's second input terminal. Generating the voltage feedback signal using replica transistors can enhance the amplifier's stability relative to a configuration in which the second input terminal generates the voltage feedback signal.

Figure 2:
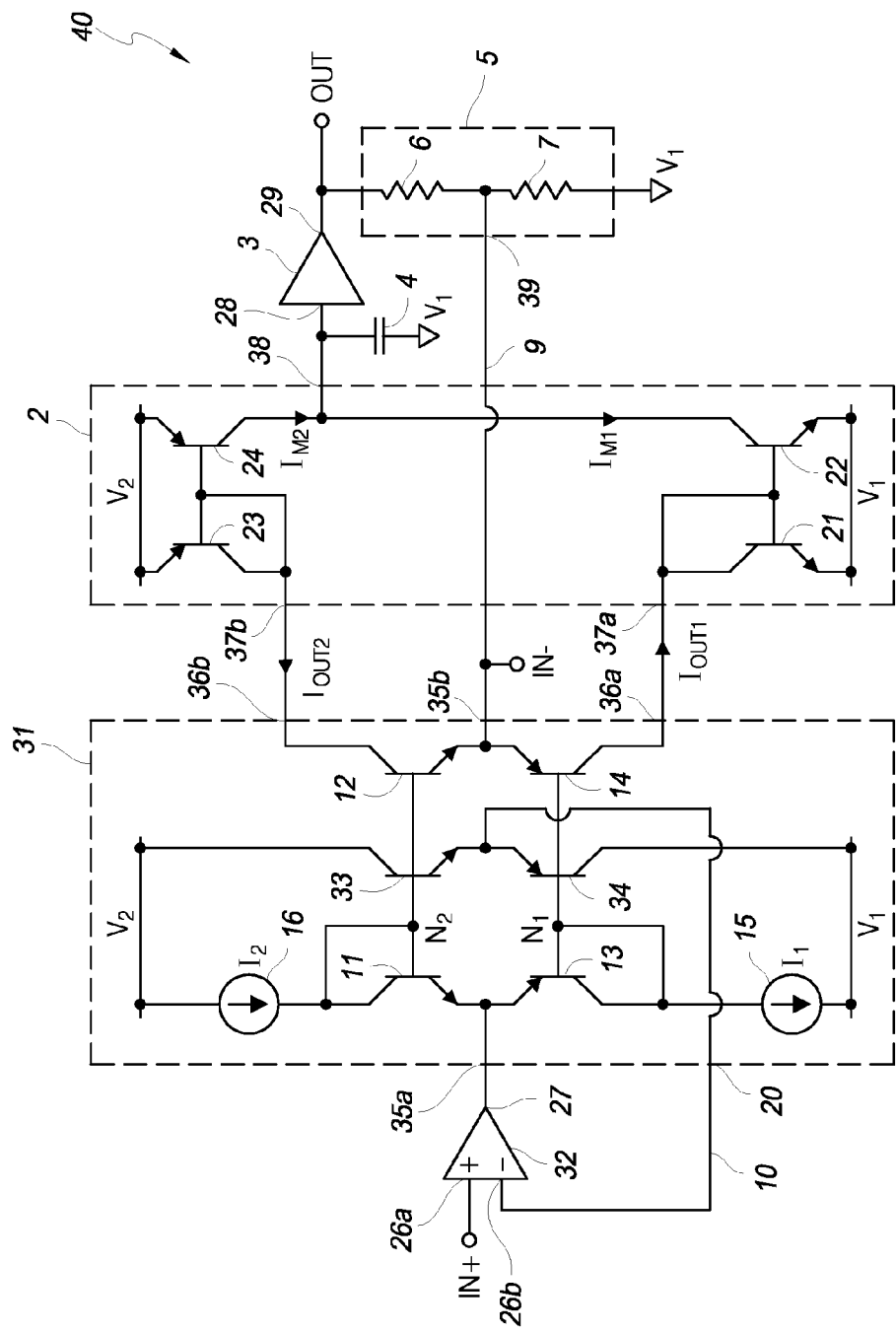
FIG. 2 is a circuit diagram of an amplifier according to one embodiment.

FIG. 2 is a circuit diagram of an amplifier 40 according to one embodiment. The amplifier 40 includes a first or non-inverting input terminal IN+, a second or inverting input terminal IN−, an output terminal OUT, a first or input stage 31, a second or current mirror stage 2, and a third or output stage 3, the feedback circuit 5, and a voltage feedback amplification circuit 32.

The input stage 31 includes a first input 35a electrically connected to an output 27 of the voltage feedback amplification circuit 32, a second input 35b electrically connected to the inverting input terminal IN− and configured to receive a current feedback signal 9, a first current output 36a electrically connected to a first current input 37a of the second stage 2, a second current output 36b electrically connected to a second current input 37b of the second stage 2, and a voltage feedback output 20 electrically connected to an inverting input 26b of the voltage feedback amplification circuit 32 and configured to generate a voltage feedback signal 10. The voltage feedback amplification circuit 32 further includes a non-inverting input 26a electrically connected to the non-inverting input terminal IN+. The second stage 2 further includes a current output 38 electrically connected to a first end of the compensation capacitor 4 and to an input 28 of the third stage 3. The compensation capacitor 4 further includes a second end electrically connected to a first or power low supply voltage $V_1$, which can be, for example, a ground supply. However, the compensation capacitor 4 can be connected in other ways, including, for example, to any suitable DC voltage. The third stage 3 further includes an output 29 electrically connected to the output terminal OUT. The feedback circuit 5 includes a first terminal electrically connected to the output terminal OUT, a second terminal electrically connected to the power low supply voltage $V_1$, and a current output 39 electrically connected to the second input 35b of the first stage 1 and configured to generate the current feedback signal 9.

The input stage 31 includes the first and second input NPN bipolar transistors 11, 12, the first and second input PNP bipolar transistors 13, 14, the first and second current sources 15, 16, a replica NPN bipolar transistor 33, and a replica PNP bipolar transistor 34. The first input 35a is electrically connected to an emitter of the first input PNP bipolar transistor 13 and to an emitter of the first input NPN bipolar transistor 11. The second input 35b is electrically connected to an emitter of the second input NPN bipolar transistor 12 and to an emitter of the second input PNP bipolar transistor 14. The first input PNP bipolar transistor 13 further includes a base and collector electrically connected to a first terminal of the first current source 15, to a base of the replica PNP bipolar transistor 34, and to a base of the second input PNP bipolar transistor 14 at a first node $N_1$. The first current source 15 further includes a second terminal electrically connected to the power low supply voltage $V_1$. The first input NPN bipolar transistor 11 further includes a base and collector electrically connected to a first terminal of the second current source 16, to a base of the replica NPN bipolar transistor 33, and to a base of the second input NPN bipolar transistor 12 at a second node $N_2$. The second current source 16 further includes a second terminal electrically connected to a second or power high supply voltage $V_2$. The first current output 36a is electrically connected to a collector of the second input PNP bipolar transistor 14. The second current output 36b is electrically connected to a collector of the second input NPN bipolar transistor 12. The replica NPN bipolar transistor 33 further includes a collector electrically connected to the power high supply voltage $V_2$. The replica PNP bipolar transistor 34 further includes a collector electrically connected to the power low supply voltage $V_1$ and an emitter electrically connected to an emitter of the replica NPN bipolar transistor 33 and to the voltage feedback output 20. In the illustrated configuration, the emitters of the replica NPN and PNP bipolar transistors 33, 34 can be used to generate the voltage feedback signal 10.

The second stage 2 includes first and second current mirror NPN bipolar transistors 21, 22 and first and second current mirror PNP bipolar transistors 23, 24. The first current input 37a is electrically connected to a base and collector of the first current mirror NPN bipolar transistor 21 and to a base of the second current mirror NPN bipolar transistor 22. The first and second current mirror NPN bipolar transistors 21, 22 each further include an emitter electrically connected to the power low supply voltage $V_1$. The second current input 37b is electrically connected to a base and collector of the first current mirror PNP bipolar transistor 23 and to a base of the second current mirror PNP bipolar transistor 24. The first and second current mirror PNP bipolar transistors 23, 24 each further include an emitter electrically connected to the power high supply voltage $V_2$. The current output 38 is electrically connected to a collector of the second current mirror NPN bipolar transistor 22 and to a collector of the second current mirror PNP bipolar transistor 24. Although the second stage 2 illustrates one implementation of the second stage 2 that can be used in the amplifier 40, other implementations are possible, including, for example, configurations using a different arrangement and/or type of current mirrors or configurations in which current mirrors are omitted in favor of using other implementations of amplification circuitry.

The feedback circuit 5 includes first and second feedback resistors 6, 7. The first feedback resistor 6 includes a first end electrically connected to the output terminal OUT and a second end electrically connected to a first end of the second feedback resistor 7 and to the current output 39, which can generate the current feedback signal 9. The second feedback resistor 7 further includes a second end electrically connected to the power low supply voltage $V_1$. Although the feedback circuit 5 illustrates one suitable implementation of feedback circuitry for generating the current feedback signal 9, other implementations of the feedback circuit 5 can be used, including, for example, configurations using a different components, a different arrangement or components, and/or configurations in which a connection to the power low supply voltage $V_1$ is omitted in favor of using another reference voltage.

The first and second current outputs 36a, 36b of the input stage 31 can be used to generate first and second output currents $I_{OUT1}$, $I_{OUT2}$, respectively, which can change in relation to a differential input signal received between the non-inverting terminal IN+ and the inverting terminal IN− and the current feedback signal 9.

For example, in the absence of a differential input signal and the current feedback signal 9, the first and second input PNP bipolar transistors 13, 14 can mirror a first bias current $I_1$ of the first current source 15 to generate the first output current $I_{OUT1}$ and the first and second input NPN bipolar transistors 11, 12 can mirror a second bias current $I_2$ of the second current source 16 to generate the second output current $I_{OUT2}$. However, when a differential input signal causes a voltage level of the non-inverting input terminal IN+ to increase relative to a voltage level of the inverting terminal IN−, a voltage level of the first and second nodes $N_1$, $N_2$ can also increase, which can result in a magnitude of the second current $I_{OUT2}$ increasing and a magnitude of the first output current $I_{OUT1}$ decreasing. Similarly, when a differential input signal causes the voltage level of the non-inverting input terminal IN+ to decrease relative to the voltage level of the inverting terminal IN−, the voltage level of the first and second nodes $N_1$, $N_2$ can also decrease, which can result in the magnitude of the second current $I_{OUT2}$ decreasing and the magnitude of the first output current $I_{OUT1}$ increasing. Furthermore, the magnitudes of the first and second output currents $I_{OUT1}$, $I_{OUT2}$ can be adjusted or changed by the current feedback signal 9, which can sink or source current from the input stage's second input 35b.

The second stage 2 can be used to mirror the first and second output currents $I_{OUT1}$, $I_{OUT2}$ to generate first and second mirrored currents $I_{M1}$, $I_{M2}$, which can be combined and provided to the compensation capacitor 4 using the second stage's current output 38. In certain implementations, the first and second mirrored currents $I_{M1}$, $I_{M2}$ are generated by amplifying the first and second output currents $I_{OUT1}$, $I_{OUT2}$, respectively, such as by amplifying the output currents by a factor in the range of about 1 to about 20. However, persons having ordinary skill in the art will readily ascertain other suitable amplification factors.

The first and second mirrored currents $I_{M1}$, $I_{M2}$ can be used to charge or discharge the compensation capacitor 4, thereby controlling the compensation capacitor's voltage. The output stage 3 can be configured to control a voltage level of the output terminal OUT based on the voltage across the compensation capacitor 4. For example, in certain implementations, the output stage 3 is configured to operate as a voltage buffer that controls the voltage level of the output terminal OUT to be about equal to the voltage across the compensation capacitor 4. Although one implementation of the output stage 3 has been described, other configurations of the output stage 3 can be used.

The feedback circuit 5 can generate the current feedback signal 9, which can be provided into the second input 35b of the first stage 31, thereby changing the magnitude of the first and/or second output currents $I_{OUT1}$, $I_{OUT2}$. Since the first and second output currents $I_{OUT1}$, $I_{OUT2}$ can be mirrored by the second stage 2 and used to charge or discharge the compensation capacitor 4, the current feedback signal 9 can be used to change the compensation capacitor's voltage, thereby controlling the voltage level of the output terminal OUT. The feedback provided by the current feedback signal 9 can be used to balance or equalize the first and second output currents $I_{OUT1}$, $I_{OUT2}$ in the steady-state.

In addition to including current feedback, the amplifier 40 has also been implemented to include voltage feedback. For example, the voltage feedback amplification circuit 32 is electrically connected in a voltage feedback configuration that can be used to control a voltage level of the inverting input terminal IN− based on a voltage level of the non-inverting input terminal IN+. For example, the voltage feedback can be used to control the voltage levels of the non-inverting and inverting input terminals IN+, IN− to be about equal when no differential input signal is received between the non-inverting and inverting input terminals IN+, IN−.

In the illustrated configuration, the voltage feedback amplification circuit 32 has been configured to receive the voltage feedback signal 10 that has been generated using the replica NPN and PNP bipolar transistors 33, 34. Since the voltage feedback signal 10 can track or follow the voltage level of the inverting input terminal IN− and since the output 27 of the voltage feedback amplification circuit 32 can be controlled to a voltage level in which the non-inverting and inverting inputs 26a, 26b are about equal, the voltage feedback amplification circuit 32 can be used to control the inverting input terminal IN− to be about equal to the non-inverting input terminal IN+ when no differential input signal is received. Including the voltage feedback amplification circuit 32 can aid in reducing the amplifier's input offset voltage and/or increasing the amplifier's common-mode rejection ratio (CMRR). Additionally, the voltage feedback amplification circuit 32 can operate in a unity gain closed-loop configuration, and thus the amplifier's bandwidth need not change as the amplifier's closed-loop gain is increased.

Using the replica NPN and PNP bipolar transistors 33, 34 to generate the voltage feedback signal 10 at least in part can improve the overall performance of the amplifier 40 relative to a configuration in which the inverting input 26b of the voltage feedback amplification circuit 32 is connected to the inverting input terminal IN−. For example, the replica NPN bipolar transistor 33 and the replica PNP bipolar transistor 34 can mimic or replicate the behavior of the second input NPN bipolar transistor 12 and the second input PNP bipolar transistor 14, respectively, and thus the voltage feedback signal 10 can change in relation to or track the voltage level of the inverting input terminal IN− and can be used to provide voltage feedback suitable for reducing the amplifier's input offset error and/or improving the amplifier's CMRR. Additionally, using the replica NPN and PNP bipolar transistors 33, 34 rather than the inverting input terminal IN− to generate the voltage feedback signal 10 can improve the stability of the amplifier 40. For example, when the inverting input terminal IN− is electrically connected to the inverting input 26b of the voltage feedback amplification circuit 32, bandwidth roll-off of the voltage feedback amplification circuit 32 can cause the inverting input terminal IN− to appear inductive for at least a portion of the input signal frequency range, which can result in amplifier instability and/or oscillation.

Although the illustrated amplifier 40 includes three stages, persons having ordinary skill in the art will recognize that the amplifier 40 can be modified to have more or fewer stages, including stages of a same and/or of a different type.

Figure 3:
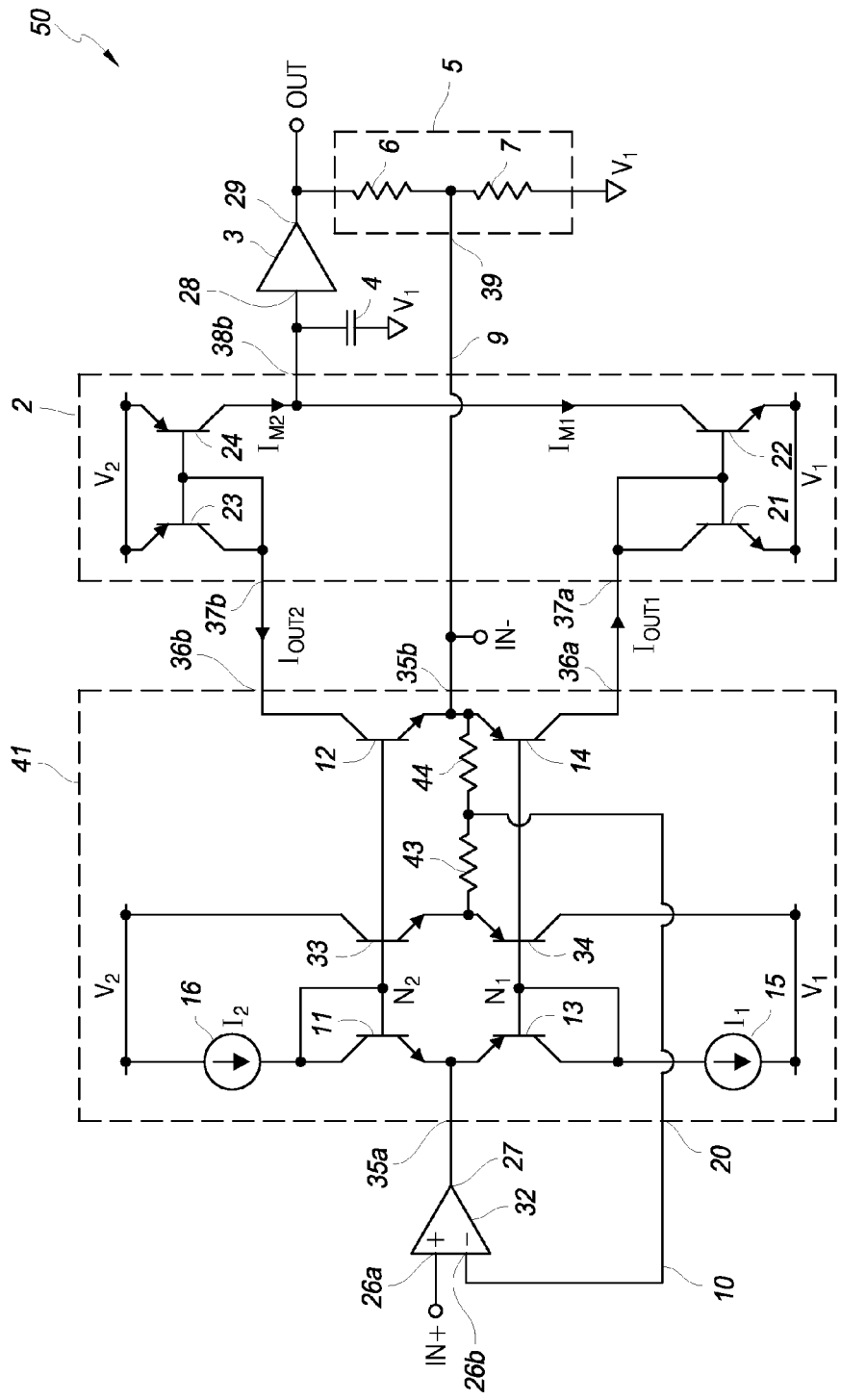
FIG. 3 is a circuit diagram of an amplifier according to another embodiment.

FIG. 3 is a circuit diagram of an amplifier 50 according to another embodiment. The amplifier 50 includes the non-inverting input terminal IN+, the inverting input terminal IN−, the output terminal OUT, a first or input stage 41, the second stage 2, the third stage 3, the feedback circuit 5, and the voltage feedback amplification circuit 32.

The amplifier 50 of FIG. 3 is similar to the amplifier 40 of FIG. 2, except that the amplifier 50 includes a different arrangement of an input stage. For example, in contrast to the input stage 31 of FIG. 2, the input stage 41 of FIG. 3 illustrates a configuration that further includes a first interpolation resistor 43 and a second interpolation resistor 44. The first interpolation resistor 43 includes a first end electrically connected to the emitters of the replica NPN and PNP bipolar transistors 33, 34. The second interpolation resistor 44 includes a first end electrically connected to the inverting input terminal IN− and a second end electrically connected to a second end of the first interpolation resistor 43 and to the voltage feedback output 20.

The first and second interpolation resistors 43, 44 can generate the voltage feedback signal 10 based on both the voltage level of the emitters of the replica NPN and PNP bipolar transistors 33, 34 and on the voltage level of the inverting input terminal IN−. With reference back to FIG. 2, generating the voltage feedback signal 10 based on the voltage level of the emitters of the replica NPN and PNP bipolar transistors 33, 34 can aid in providing voltage feedback while avoiding the input impedance of the inverting input terminal IN− appearing inductive for certain operating conditions and/or input signal frequencies. However, using the replica NPN and PNP bipolar transistors 33, 34 can also increase noise and/or offset, since certain transistors such as the second input PNP and NPN bipolar transistors 12, 14 can be outside of the feedback loop of the voltage feedback amplification circuit 32.

The illustrated amplifier 50 includes a voltage feedback scheme in which the voltage feedback signal 10 is generated based on both the voltage level of the emitters of the replica NPN and PNP bipolar transistors 33, 34 and on the voltage level of the inverting input terminal IN−. Thus, a first portion of the feedback of the voltage feedback amplification circuit 32 can be generated using replica transistors and a second portion of the feedback of the voltage feedback amplification circuit 32 can be generated using the inverting input terminal IN−. Generating the voltage feedback signal 10 in this manner can aid in reducing input offset and/or noise by including the input stage's PNP and NPN input transistors 11-14 in the feedback loop of the voltage feedback amplification circuit 32, while providing sufficient feedback from the replica NPN and PNP bipolar transistors 33, 34 to avoid instability. In one embodiment, the sum of the resistances of the first and second interpolation resistors 43, 44 is selected to be in the range of about 1 to about 3 times the dynamic emitter impedance of the second input PNP and NPN bipolar transistors 12, 14. However, persons having ordinary skill in the art will readily ascertain other suitable resistance values.

Although the amplifier 50 of FIG. 3 can operate using feedback based on both the voltage level of the emitters of the replica NPN and PNP bipolar transistors 33, 34 and on the voltage level of the inverting input terminal IN−, the inclusion of the first and second interpolation resistors 43, 44 can impact the amplifier's performance. For example, when the first and second interpolation resistors 43, 44 are configured to have a relatively small resistance, the interpolation resistors can impact the amplifier's gain. Furthermore, when the first and second interpolation resistors 43, 44 are configured to have a relatively large resistance, the interpolation resistors can increase the overall noise of the amplifier 50.

Figure 4:
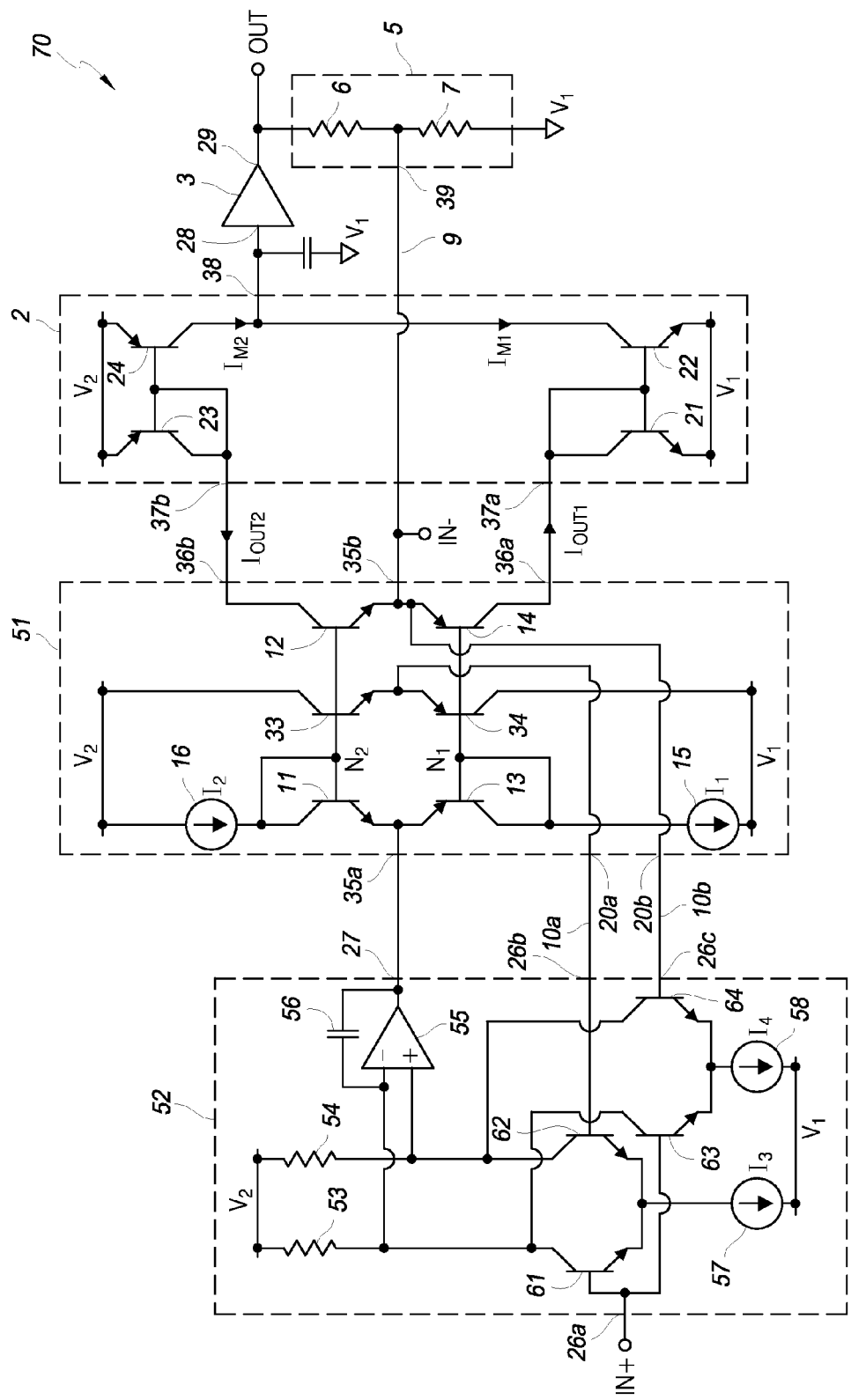
FIG. 4 is a circuit diagram of an amplifier according to another embodiment.

FIG. 4 is a circuit diagram of an amplifier 70 according to another embodiment. The amplifier 70 includes the non-inverting input terminal IN+, the inverting input terminal IN−, the output terminal OUT, a first or input stage 51, the second stage 2, the third stage 3, the feedback circuit 5, and a voltage feedback amplification circuit 52.

The amplifier 70 of FIG. 4 is similar to the amplifier 40 of FIG. 2, except that the amplifier 70 includes a different arrangement of an input stage and of a voltage feedback amplification circuit. For example, in contrast to the input stage 31 of FIG. 2 that generates a voltage feedback signal 10 based on the voltage level of the emitters of the replica NPN and PNP bipolar transistors 33, 34, the input stage 51 of FIG. 4 includes a first voltage output 20a that generates a first voltage feedback signal 10a based on the voltage level of the emitters of the replica NPN and PNP bipolar transistors 33, 34 and a second voltage output 20b that generates a second voltage feedback signal 10b based on the voltage level of the inverting input terminal IN−. As will be described below, the voltage feedback amplification circuit 52 can use the first and second voltage feedback signals 10a, 10b to reduce the amplifier's offset and noise while maintaining amplifier stability.

The voltage feedback amplification circuit 52 includes a first input 26a electrically connected to the non-inverted input terminal IN+, a second input 26b configured to receive the first voltage feedback signal 10a, a third input 26c configured to receive the second voltage feedback signal 10b, and an output 27 electrically connected to the first input 35a of the first stage 51. The voltage feedback amplification circuit 52 further includes a first load resistor 53, a second load resistor 54, an amplification circuit 55, a capacitor 56, a third current source 57, a fourth current source 58, a first input NPN bipolar transistor 61, a second input NPN bipolar transistor 62, a third input NPN bipolar transistor 63, and a fourth input NPN bipolar transistor 64. The first and second input NPN bipolar transistors 61, 62 can operate as the first transistor differential pair and the third and fourth input NPN bipolar transistors 63, 64 can operate as the second transistor differential pair.

The first input NPN bipolar transistor 61 includes a base electrically connected to a base of the third input NPN bipolar transistor 63 and to the first input 26a. The first input NPN bipolar transistor 61 further includes a collector electrically connected to a collector of the third input NPN bipolar transistor 63, to a first end of the first load resistor 53, to a first end of the capacitor 56, and to an inverting input of the amplification circuit 55. The first input NPN bipolar transistor 61 further includes an emitter electrically connected to an emitter of the second input NPN bipolar transistor 62 and to a first terminal of the third current source 57. The third current source 57 further includes a second terminal electrically connected to the power low supply voltage $V_1$. The second input NPN bipolar transistor 62 further includes a base electrically connected to the second input 26b and configured to receive the first voltage feedback signal 10a. The second input NPN transistor 62 further includes a collector electrically connected to a collector of the fourth input NPN bipolar transistor 64, to the first end of the second load resistor 54 and to a non-inverting input of the amplification circuit 55. The fourth input NPN bipolar transistor 64 further includes a base electrically connected to the third input 26c and configured to receive the second voltage feedback signal 10b. The fourth input NPN bipolar transistor 64 further includes an emitter electrically connected to an emitter of the third input NPN bipolar transistor 63 and to a first terminal of the fourth current source 58. The fourth current source 58 further includes a second terminal electrically connected to the power low supply voltage $V_1$. The first and second load resistors 53, 54 each further include a second electrically connected to the power high supply voltage $V_2$. The amplification circuit 55 further includes an output electrically connected to a second end of the capacitor 56 and to the output 27.

The illustrated amplifier 70 of FIG. 4 can operate using multiple voltage feedback paths while avoiding a need for the first and second interpolation resistors 43, 44 of FIG. 3, which can increase noise and/or attenuate current feedback associated with the current feedback signal 9. For example, the voltage feedback amplification circuit 52 uses a voltage feedback scheme in which the strength of multiple voltage feedback paths can be adjusted by controlling a strength of the amplification circuit's input transistor differential pairs relative to one another. The strength of the input transistor differential pairs can be controlled by, for example, sizing the emitter areas of the third and fourth input NPN bipolar transistors 63, 64 relative to the emitter areas of the first and second input NPN bipolar transistors 61, 62 and/or by scaling a third bias current $I_3$ of the third current source 57 relative to a fourth bias current $I_4$ current of the fourth current source 58.

In one embodiment, the voltage feedback amplification circuit 52 is configured such that the feedback strength of the second voltage feedback signal 10b is between about 1 times and about 4 times greater than the feedback strength of the first voltage feedback signal 10a. Configuring the voltage feedback amplification circuit in this manner can provide enhanced performance relative to a scheme in which only a single voltage feedback signal is used. For example, simulations based on using the second voltage feedback signal 10b to provide about 65% of the amplifier's voltage feedback and using the first voltage feedback signal 10a to provide about 35% of the amplifier's voltage feedback showed an overall gain-bandwidth product improvement of over 100 times relative to a conventional voltage feedback amplifier operating using about the same supply current. Although certain feedback strengths have been described above, persons having ordinary skill in the art will readily ascertain other suitable values.

Figure 5:
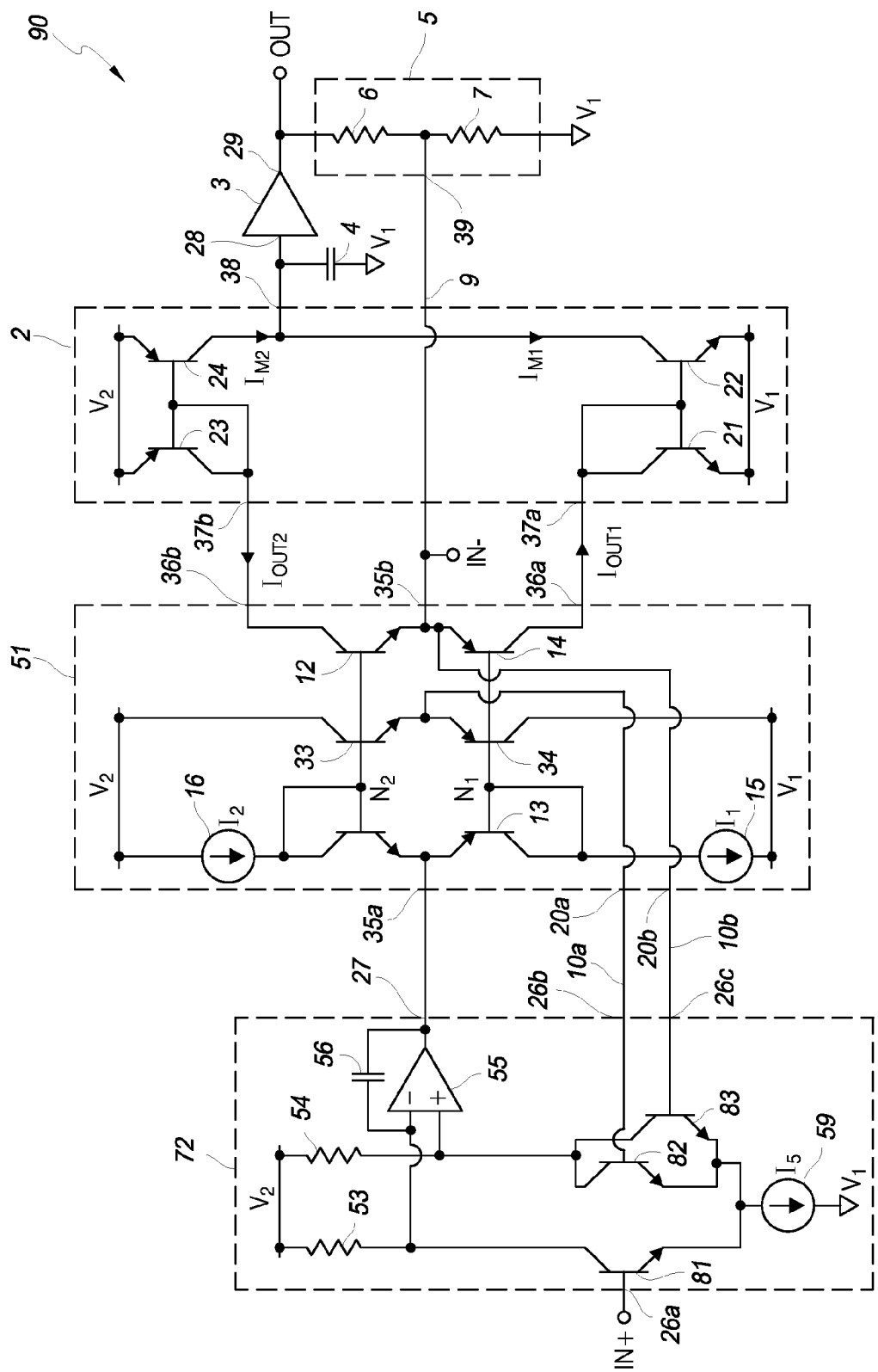
FIG. 5 is a circuit diagram of an amplifier according to another embodiment.

FIG. 5 is a circuit diagram of an amplifier 90 according to another embodiment. The amplifier 90 includes the non-inverting input terminal IN+, the inverting input terminal IN−, the output terminal OUT, the input stage 51, the second stage 2, the third stage 3, the feedback circuit 5, and a voltage feedback amplification circuit 72.

The amplifier 90 of FIG. 5 is similar to the amplifier 70 of FIG. 4, except that the amplifier 90 includes a different arrangement of a voltage feedback amplification circuit. For example, as will be described below, the voltage feedback amplification circuit 72 of FIG. 5 uses a voltage feedback scheme in which the feedback strength of the first voltage feedback signal 10a relative to the feedback strength of the second voltage feedback signal 10b can be controlled by the relative sizing of a pair of transistors, such as by a ratio of emitter areas.

The voltage feedback amplification circuit 72 includes the first input 26a, the second input 26b, the third input 26c, the output 27, the first and second load resistors 53, 54, the amplification circuit 55, and the capacitor 56, which can be as described earlier with respect to the voltage feedback amplification circuit 52 of FIG. 4. The voltage feedback amplification circuit 72 further includes a fifth current source 59 and first to third input NPN bipolar transistors 81-83.

The first input NPN bipolar transistor 81 includes a base electrically connected to the first input 26a and an emitter electrically connected to a first terminal of the fifth current source 59, to an emitter of the second input NPN bipolar transistor 82, and to an emitter of the third input NPN bipolar transistor 83. The first input NPN bipolar transistor 81 further includes a collector electrically connected to the first end of the first load resistor 53, to the inverting input of the amplification circuit 55, and to the first end of the capacitor 56. The fifth current source 59 further includes a second terminal electrically connected to the power low supply voltage $V_1$. The fifth current source 59 can be used to generate a fifth bias current $I_5$ for biasing the emitters of the first to third input NPN bipolar transistors 81-83. The second input NPN bipolar transistor 82 further includes a base electrically connected to the second input 26b and configured to receive the first voltage feedback signal 10a. The third input NPN bipolar transistor 83 further includes a base electrically connected to the third input 26c and configured to receive the second voltage feedback signal 10b. The second input NPN bipolar transistor 82 further includes a collector electrically connected to a collector of the third input NPN bipolar transistor 83, to the non-inverting input of the amplification circuit 55, and to the first end of the second load resistor 54.

The voltage feedback amplification circuit 72 can be used to control a feedback strength of the first voltage feedback signal 10a relative to a feedback strength of the second voltage feedback signal 10b by controlling a strength of the second input NPN bipolar transistor 82 relative to a strength of the third input NPN bipolar transistor 83. For example, the feedback strength of the first voltage feedback signal 10a can be increased relative to the feedback strength of the second voltage feedback signal 10b by increasing an emitter area of the second input NPN bipolar transistor 82 relative to an emitter area of the third input NPN bipolar transistor 83. In one embodiment, the emitter area of the second input NPN bipolar transistor 82 is larger than the emitter area of the third input NPN bipolar transistor 83 by a factor in the range of about 1 to about 4. Although one example of emitter areas has been provided, other sizes or ratios will be readily appreciated by persons having ordinary skill in the art.

With reference now to FIGS. 2-5, in certain embodiments, an amplifier that includes a voltage feedback amplification circuit is formed on an IC, and external feedback circuitry is used to provide current feedback to the amplifier, thereby providing the amplifier with both voltage feedback and current feedback error correction. For example, a non-inverting input terminal IN+, an inverting input terminal IN−, and an output terminal OUT can each be connected to separate pins of the IC. Additionally, current feedback can be provided by, for example, connecting a first feedback resistor between the pin of the output terminal OUT and the pin of the inverting input terminal IN− and a second feedback resistor between the pin of the inverting input terminal IN− and a DC voltage, such as a ground or power low supply. However, other configurations of feedback circuitry can be used.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. For example, amplifiers can be used in consumer electronic products, parts of the consumer electronic products, electronic test equipment, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, a global positioning system (GPS) device, a remote control device, a wireless network terminal, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An amplifier comprising:
   a first input terminal;
   a second input terminal;
   an input stage comprising a first input and a second input, the second input electrically connected to the second input terminal, the input stage configured to generate a first current at a first current output, the input stage configured to generate a second current at a second current output, and the input stage configured to generate a first voltage feedback signal at a voltage feedback output, the first voltage feedback signal indicative of a voltage level of the second input terminal, wherein the second input of the input stage is configured to receive a current feedback signal, and wherein the first and second currents change in response to the current feedback signal, wherein the voltage feedback output is not a same node as the second input; and
   a voltage feedback circuit including a first input electrically connected to the first input terminal, a second input configured to receive the first voltage feedback signal, and an output electrically connected to the first input of the input stage, wherein the voltage feedback circuit is configured to control the voltage level of the second input terminal based on the voltage level of the first input terminal.

2. The amplifier of claim 1, wherein the input stage further comprises:
   a first input bipolar transistor configured to generate the first current;
   a second input bipolar transistor configured to generate the second current;
   a first replica bipolar transistor, wherein the first replica bipolar transistor is a replica of the first input bipolar transistor; and
   a second replica bipolar transistor, wherein the second replica bipolar transistor is a replica of the second input bipolar transistor,
   wherein the voltage feedback signal is generated at least in part by the first and second replica bipolar transistors.

3. The amplifier of claim 2, wherein the first input bipolar transistor and the first replica bipolar transistor are PNP bipolar transistors, and wherein the second input bipolar transistor and the second replica bipolar transistor are NPN bipolar transistors.

4. The amplifier of claim 3, wherein the first input terminal is electrically connected to an emitter of the first input bipolar transistor and to an emitter of the second input bipolar transistor, and wherein a base of the first input bipolar transistor is electrically connected to a base of the first replica bipolar transistor, and wherein a base of the second input bipolar transistor is electrically connected to a base of the second replica bipolar transistor, and wherein an emitter of the first replica bipolar transistor is electrically connected to an emitter of the second replica bipolar transistor.

5. The amplifier of claim 4, wherein the input stage further comprises a third input bipolar transistor and a fourth input bipolar transistor, and wherein the third input bipolar transistor is a PNP bipolar transistor and the fourth input bipolar transistor is an NPN bipolar transistor, and wherein the output of the voltage feedback circuit is electrically connected to an emitter of the third input bipolar transistor and to an emitter of the fourth input bipolar transistor, and wherein a base of the third input bipolar transistor is electrically connected to the base of the first input bipolar transistor, and wherein a base of the fourth input bipolar transistor is electrically connected to the base of the second input bipolar transistor.

6. The amplifier of claim 4, wherein the emitters of the first and second replica bipolar transistors are configured to generate the first voltage feedback signal.

7. The amplifier of claim 4, wherein the emitters of the first and second input bipolar transistors are configured to generate a second voltage feedback signal, and wherein the voltage feedback circuit further includes a third input configured to receive the third voltage signal.

8. The amplifier of claim 7, wherein a feedback strength of the first voltage feedback signal is controlled relative to a feedback strength of the second voltage feedback signal by a ratio of an emitter area of a first feedback bipolar transistor to an emitter area of a second feedback bipolar transistor.

9. The amplifier of claim 7, wherein a feedback strength of the first voltage feedback signal is controlled relative to a feedback strength of the second voltage feedback signal by using a first differential transistor pair and a second differential transistor pair.

10. The amplifier of claim 4, further comprising a first interpolation resistor and a second interpolation resistor, wherein the first interpolation resistor is electrically connected between the emitters of the first and second replica bipolar transistors and the voltage output of the input stage, and wherein the second interpolation resistor is electrically connected between the emitters of the first and second input bipolar transistors and the voltage output of the input stage.

11. The amplifier of claim 1, wherein the amplifier further includes a current mirror stage and a compensation capacitor, wherein the current mirror stage is configured to mirror the first current to generate a first mirrored current and to mirror the second current to generate a second mirrored current, and wherein the current mirror stage is further configured to control a voltage across the compensation capacitor based on the first and second mirrored currents.

12. The amplifier of claim 11, wherein the amplifier further includes an output stage and an output terminal, wherein the output stage is configured to control a voltage level of the output terminal based on the voltage across the compensation capacitor.

13. The amplifier of claim 12, further comprising a feedback circuit electrically connected between the output terminal and the second input terminal and configured to generate the current feedback signal.

14. The amplifier of claim 13, wherein the feedback circuit comprises a first feedback resistor and a second feedback resistor, wherein the first feedback resistor is electrically connected between the output terminal and the second input terminal, and wherein the second feedback resistor is electrically connected between the second input terminal and a power low supply voltage.

15. The amplifier of claim 1, wherein the voltage feedback circuit is configured to control the voltage levels of the first and second input terminals to be about equal when a differential input signal is not provided between the first and second input terminals.

16. A method of electronic amplification, the method comprising:
receiving an input differential signal between a first input terminal and a second input terminal;
generating a first current and a second current using an input amplification stage, wherein the first and second currents are configured to change in response to the input differential signal;
balancing the first and second currents using a current feedback signal;
generating a voltage feedback signal using the input amplification stage, wherein the voltage feedback signal indicates a voltage level of the second input terminal, wherein the voltage feedback signal is not taken from the second input terminal; and
controlling the voltage level of the second input terminal relative to a voltage level of the first input terminal using the voltage feedback signal.

17. The method of claim 16, wherein generating the first and second output currents comprises generating the first output current using a first input bipolar transistor of the input amplification stage and generating the second output current using a second input bipolar transistor of the input amplification stage, wherein the second input terminal is electrically connected to an emitter of the first input bipolar transistor and to an emitter of the second input bipolar transistor.

18. The method of claim 17, wherein generating the voltage feedback signal comprises generating the voltage feedback signal at least in part using a first replica bipolar transistor and a second replica bipolar transistor, wherein the first replica bipolar transistor is a replica of the first input bipolar transistor, and wherein the second replica bipolar transistor is a replica of the second input bipolar transistor.

19. An amplifier comprising:
a first input terminal;
a second input terminal;
an input bipolar transistor pair configured to generate a first current and a second current in response to a current feedback signal and an input differential signal received between the first input terminal and the second input terminal;
a replica bipolar transistor pair configured to generate a voltage feedback signal at least in part, wherein the replica bipolar transistor pair are replicas of the input bipolar transistor pair; and
a voltage feedback circuit configured to receive the voltage feedback signal, wherein the voltage feedback circuit is configured to control the voltage level of the second input terminal relative to the voltage level of the first input terminal based on the voltage feedback signal.

20. A method of electronic amplification, the method comprising:
receiving an input differential signal between a first input terminal and a second input terminal;
generating a first current and a second current using an input amplification stage, wherein the first and second currents are configured to change in response to the input differential signal;
mirroring the first current and the second current to generate a first mirrored current and a second mirrored current, respectively;
controlling a voltage level of an output terminal based at least in part on the first and second mirrored currents;
generating a current feedback signal using a feedback circuit electrically coupled to the output terminal, wherein the first and second currents are configured to change in response to the current feedback signal;
replicating a portion of the input amplification stage to generate a voltage feedback signal; and
controlling the voltage level of the second input terminal relative to a voltage level of the first input terminal using the voltage feedback signal.

* * * * *